United States Patent [19]

Shiomi et al.

[11] Patent Number: 5,242,663
[45] Date of Patent: Sep. 7, 1993

[54] METHOD OF AND APPARATUS FOR SYNTHESIZING HARD MATERIAL

[75] Inventors: Hiromu Shiomi; Naoji Fujimori; Nobuhiro Ota; Takahiro Imai, all of Hyogo, Japan

[73] Assignee: Sumitomo Electric Industries, Ltd., Osaka, Japan

[21] Appl. No.: 584,912

[22] Filed: Sep. 18, 1990

[30] Foreign Application Priority Data

Sep. 20, 1989 [JP] Japan .................................. 1-245749
Aug. 31, 1990 [JP] Japan .................................. 2-231649

[51] Int. Cl.$^5$ ............................................ B01J 19/12
[52] U.S. Cl. .......................... 422/186.29; 422/186.04
[58] Field of Search .................... 427/39, 45.1, 47; 204/192.32; 428/408; 422/186.05

[56] References Cited

U.S. PATENT DOCUMENTS

| | | | |
|---|---|---|---|
| 4,233,109 | 11/1980 | Nishizawa | 156/643 |
| 4,418,085 | 11/1983 | Wickersham et al. | 204/192.15 |
| 4,434,188 | 2/1984 | Kamo et al. | 427/575 |
| 4,600,563 | 7/1986 | Diederich | 422/186.29 |
| 4,663,183 | 5/1987 | Ovshinsky et al. | 427/39 |
| 4,673,589 | 6/1987 | Standley | 427/39 |
| 4,701,301 | 10/1987 | Kuwahara et al. | 419/21 |
| 4,711,767 | 12/1987 | Diederich | 422/186.29 |
| 4,725,345 | 2/1988 | Sakamoto et al. | 204/192.31 |
| 4,816,286 | 3/1989 | Hirose | 427/39 |
| 4,935,303 | 6/1990 | Ikoma et al. | 428/408 |
| 4,971,667 | 11/1990 | Yamazaki et al. | 204/192.32 |
| 4,973,494 | 11/1990 | Yamazaki | 427/39 |
| 5,016,564 | 5/1991 | Nakamura et al. | 118/723 |

FOREIGN PATENT DOCUMENTS

| | | |
|---|---|---|
| 0305903 | 3/1989 | European Pat. Off. |
| 59-3098 | 1/1984 | Japan |
| 58-110494 | 1/1984 | Japan |
| 59-63732 | 4/1984 | Japan |
| 61-174378 | 8/1986 | Japan |
| 63-107899 | 5/1988 | Japan |

OTHER PUBLICATIONS

1046B Extended Abstracts/Electrochemical Society 87-2 (1987), Princeton, New Jersey, USA, Abstract No: 1103, p. 1536, article Entitled: "Deposition of Boron Nitride in a Microwave discharge" by Matsumoto et al.

Primary Examiner—Peter A. Nelson
Assistant Examiner—Daniel Jenkins
Attorney, Agent, or Firm—W. G. Fasse; D. H. Kane, Jr.

[57] ABSTRACT

A method of and an apparatus for vapor-phase synthesizing a hard material use a raw material gas supplied into a reaction tube (6) while irradiating a region of the reaction tube (6) with microwaves (18) of a prescribed frequency for causing a synthesizing reaction to produce the hard material along a prescribed direction, by a plasma generation. In the reaction tube (6), at least two plate electrodes (17a, 17b, 19a, 19b) are oppositely arranged in parallel vertically to electric fields of the microwaves (18), so that the plasma is excited between the plate electrodes (17a, 17b, 19a, 19b) for vapor-phase synthesizing the hard material. The microwaves (18) of high electric power are introduced into the reaction tube (6) through a waveguide (5) without loss, so that strong electric fields can be homogeneously and stably distributed between the opposite plate electrodes.

13 Claims, 3 Drawing Sheets

METHOD OF AND APPARATUS FOR SYNTHESIZING HARD MATERIAL

FIELD OF THE INVENTION

The present invention relates to a method of and an apparatus for synthesizing a hard material, such as diamond or cubic boron nitride, which is used in connection with tools, a thermal conductors or as a semiconductor material. More particularly, the invention relates to a method of and an apparatus for homogeneously vapor-phase synthesizing a high-quality hard material at a high rate over a wide area.

BACKGROUND INFORMATION

Hard materials such as diamond, cubic boron nitride and wurtzite boron nitride are widely applied to tools such as cutting tools, wear-resistant components, abrasive grains and the like due to the high hardness of these materials. These materials are also applied to heat radiation substrates for semiconductor elements due their to high thermal conductivity. Further, research has been made in order to apply these materials to optical elements and semiconductor materials for effectuating the light transmissivity thereof.

These materials, which are stable under high pressure as high pressure phase materials, were initially artificially synthesized only under superhigh pressure. Various methods have been recently developed for synthesizing such hard materials, including diamond, from decompressed vapor phases. Among such methods of vapor-phase synthesizing hard materials, a microwave plasma CVD process of generating plasma by microwaves for decomposing gas and depositing a hard material on a substrate is an excellent method which can synthesize a hard material of high purity. Japanese Patent Laying-Open Gazettes Nos. 58-110494, 59-3098 and 59-63732, and U.S. Pat. No. 4,434,188 disclose methods for synthesizing hard materials through the microwave plasma CVD process.

FIG. 1 shows a conventional apparatus for vapor-phase synthesizing diamond through microwaves. This apparatus will be now schematically described.

Referring to FIG. 1, microwaves oscillated by a magnetron oscillator 1 are applied to a substrate 8, which is placed on a support 7 provided in a reaction tube 6, through an isolator 2, a power monitor 3, a tuner 4 and a waveguide 5. Raw material gas, which is prepared by mixing methane gas, hydrogen etc. at a prescribed ratio, for example, is introduced through a gas inlet port 9 and exhausted from an exhaust port 10 by a pump (not shown) The discharge of the raw material gas is so adjusted that a prescribed pressure is maintained in the reaction tube 6. Plasma 11 is generated by the energy of the microwaves, to form diamond on the substrate 8. A cooling water supply tube 13 supplies an applicator 12 with cooling water, which in turn is discharged from a cooling water discharge tube 14, in order to prevent an excessive heating of the reaction tube 6.

The waveguide 5 implements optimal conditions of compatibility by movement of a plunger 15 or adjustment of the tuner 4 in response to the wavelength of the introduced microwaves.

As shown in FIG. 1, the raw material gas is introduced into and exhausted from the apparatus along arrows A and B respectively.

Japanese Patent Laying-Open Gazette No. 61-174378 or the like also discloses a method of synthesizing cubic boron nitride through such a microwave plasma CVD apparatus.

In general, electromagnetic waves in a frequency domain or range of 300 MHz to 300 GHz are called microwaves. The electromagnetic waves of this frequency domain are easily absorbed by molecules, and have wavelengths of 1 m to 1 mm, which are short compared to the size of a reaction tube. Thus, it is possible to efficiently generate plasma in gas under a wide range of pressure. Further, the microwaves of this frequency domain can efficiently supply electric power through a waveguide having a practical size of not more than scores of centimeters, with smaller problems of loss and leakage in a supply path of a coaxial cable etc., dissimilarly to waves of a lower frequency domain.

However, a method of and an apparatus for synthesizing a hard material through the aforementioned conventional microwave plasma CVD apparatus have the following problems:

While microwaves of 2.45 GHz in frequency are widely industrially employed, standing waves are caused in a cycle of a half-wave length thereof if the microwaves are trapped in a reaction tube. Thus, plasma is heterogeneously generated in response to a strength distribution of the standing waves. Therefore, it is impossible to homogeneously generate plasma over a wide area for synthesizing a hard material.

The microwaves have such a property that the same can stably generate plasma under a higher gas pressure and improve the growth rate of the hard material as the frequency thereof is increased. When the frequency of the microwaves is thus increased, however, the wavelength is shortened whereby areas where large amplitude portions of the standing waves occur are reduced.

In order to improve such growth heterogeneity in the vapor synthesis of a hard material, there has been reported a method of applying a dc magnetic field for controlling the streamline of plasma and a method of reducing the gas pressure in a reaction tube in Japanese Patent Laying-Open Gazette No. 63-107899. In any of these methods, however, mean free paths of active molecule species and electrons contained in the plasma must be kept long. Thus, the gas pressure in the reaction tube must be reduced to not more than 10 Torr, and the hard material is grown at an extremely slow rate of less than 1 $\mu$m/h.

Thus, the conventional method of synthesizing a hard material such as diamond, by the plasma CVD process has been significantly restricted in growth area and growth rate, and it has been difficult to mass-synthesize the hard material.

SUMMARY OF THE INVENTION

It is an object of the present invention to provide a method of and an apparatus for vapor-phase synthesizing a hard material such as diamond, on the surface of a wide-area substrate at a high growth rate by enabling the generation of high-concentration plasma over a wide range.

The present method of synthesizing a hard material is adapted to vapor-phase synthesizing a hard material by supplying raw material gas into a reaction tube and introducing microwaves of a prescribed frequency into a region of the reaction tube for causing a synthesizing reaction of the hard material along a prescribed direction. For performing this synthesizing method, at least two plate electrodes are oppositely arranged in parallel vertically or rather perpendicularly to the electric fields (arrow C) of the microwaves and plasma is excited between the plate electrodes for the vapor-phase synthesizing a hard material.

According to this method of synthesizing a hard material, it is possible to introduce microwaves of high electric power into the reaction tube by a waveguide at a small loss, and to homogeneously and stably distribute or maintain strong electric fields between the opposite plate electrodes. The plasma generated by the electric fields is stable under a high reaction pressure, and homogeneous over a wide area.

Although the present method of synthesizing a hard material is similar to a synthesizing method employing a plane-parallel plate electrode type plasma CVD apparatus using a high frequency which is lower than the frequency of microwaves, refer to U.S. Pat. No. 4,414,085, for example, it is difficult to stably generate a strong plasma under a relatively high pressure of at least 100 Torr in a frequency domain lower than that of the microwaves, and this method is improper the synthesis of a hard material. When the frequency used is below the range of microwaves, further significant problems are caused such as loss in an inlet path for a coaxial cable etc. including a power reflection caused by impedance non-conformity at an inlet port for the reaction tube.

The directions of electric fields and magnetic fields of microwaves which are guided by a waveguide depend on the configuration of the waveguide. The counter electrodes must necessarily be arranged vertically or rather perpendicularly to the direction (C) of the electric fields of the microwaves, so that strong electric fields can be generated between the counter electrodes. Further, the microwaves must be introduced to progress in parallel with the electrodes.

The apparatus according to the invention for synthesizing a hard material comprises a reaction tube, means for supplying raw material gas into the reaction tube, and means for generating plasma by introducing microwaves in a prescribed direction in the vicinity of a base material provided in the reaction tube for depositing a hard material. According to the present apparatus, the reaction tube is provided with at least two plate electrodes which are arranged in parallel to each other and vertically or rather perpendicularly to electric fields of the microwaves through a region provided with a base material for depositing the hard material.

It is possible to provide any suitable number of counter electrodes exceeding two. Such a large number of counter electrodes themselves may serve as base materials for growing the hard material, or a base material may be arranged between each neighboring pair of these electrodes, so that the hard material can be grown over a wider area. Thus, the yield of the hard material can be increased. Alternatively, fine particles can be arranged between the counter electrodes as base materials, thereby easily synthesizing abrasive grains of the hard material.

The distance between the opposite plate electrodes is preferably at least 5 mm, in order to facilitate the flow of reaction gas. More preferably, this distance is not more than the wavelength of the microwaves.

At least the reaction tube 6 is made of an electrically insulating material such as quartz, alumina, beryllia or boron nitride, which has small microwave transmission loss. The plate electrodes are preferably made of a heat-resistant metal material having a high microwave reflection factor, such as SUS, Mo or W, for example. If the plate electrodes also serve as the base materials for growing the hard material, the base materials for the plate electrodes are prepared by using a conductive material such as a metal or semiconductor material.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
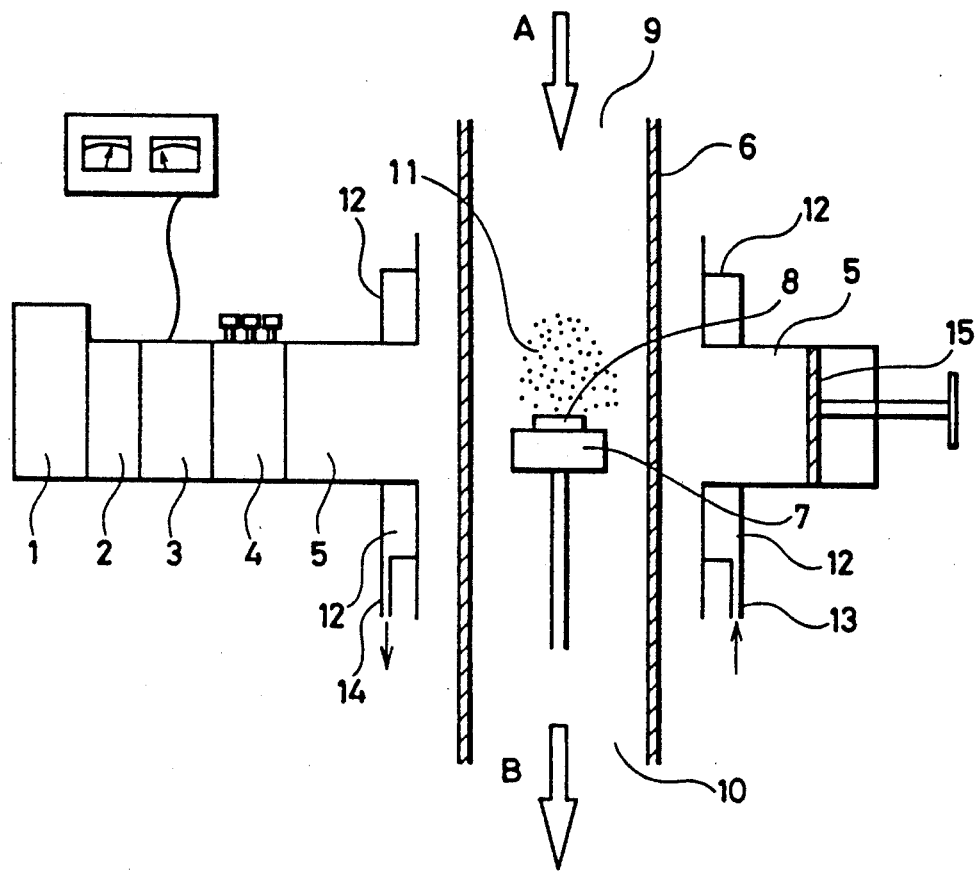
FIG. 1 is a sectional view typically showing a conventional vapor synthesizing apparatus employed for vapor-phase synthesizing diamond.
Figure 2:
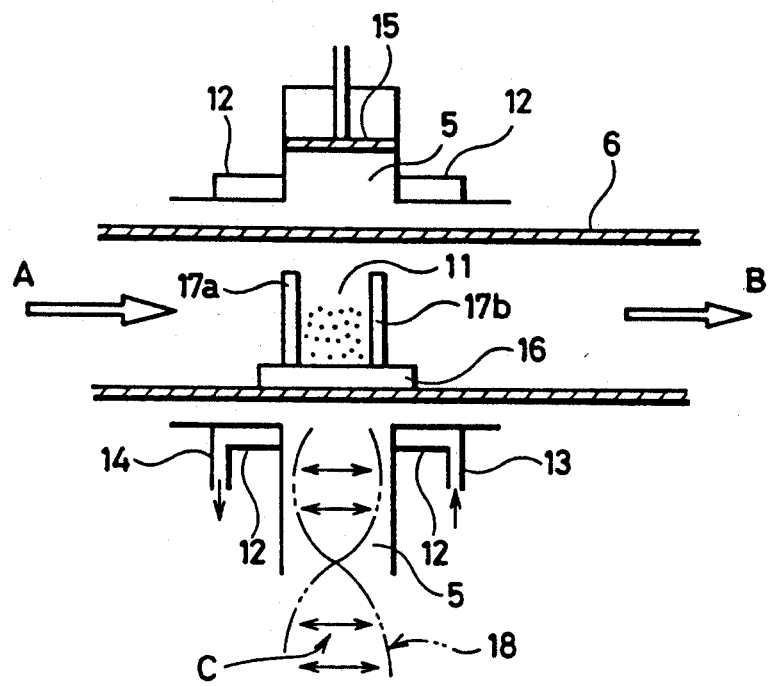
FIG. 2 is a sectional view typically showing an apparatus of the invention for synthesizing a hard material employed in Example 1 of the invention.

According to the present invention, a hard material is vapor-phase synthesized by the present apparatus shown in FIG. 2. Referring to FIG. 2, microwaves 18 are first applied through a waveguide 5 to a space defined between two base materials 17a and 17b which are oppositely placed on a support 16 provided in a reaction tube 6. While no detail of microwave generation means is shown in FIG. 2, the microwaves 18 are oscillated by a magnetron oscillator shown in FIG. 1 1 and introduced into the reaction tube 6 through an isolator 2, a power monitor 3, a tuner 4 and the waveguide 5, similarly to the conventional apparatus shown in FIG. 1.

The two base materials 17a and 17b, which are made of silicon, form substrates to be coated and are arranged vertically or rather perpendicularly to the direction (shown by arrows C) of electric fields of the microwaves 18, to serve as counter electrodes which establish a homogenous and stable electric field between these electrodes. Plasma 11 is generated by the microwaves 18 which are introduced between the base materials 17a and 17b, whereby raw material gas is vapor-phase synthesized to simultaneously form hard material films on the base materials 17a and 17b, for example in the form of two flat plates. A cooling water supply tube 13 supplies an applicator 12 with cooling water, which in turn is discharged from a cooling water discharge tube 14, in order to prevent excessive heating of the support 16. Arrows A and B indicate the introduction and exhaustion respectively of raw material gas.

Such an apparatus was employed in Example 1 for synthesizing diamond under the following operating conditions: The reaction tube 6 had an inner diameter of 60 mm. The base materials 17a and 17b were prepared as silicon discs having a diameter of 50 mm and a thickness of 3 mm. The spacing between the discs was 25 mm. A reaction gas containing $H_2$ and $CH_4$ in the ratio 10:2, was supplied into the reaction tube 6 as shown by arrow A. The discharge of the reaction gas arrow B was so adjusted that the pressure in the reaction tube 6 was 60 Torr. The input power of the microwaves was 600 W.

As a result, diamond films were formed on both of the base materials 17a and 17b over ranges of 40 mm in diameter at a high growth rate of 5 $\mu$m/h. Such an effective result was obtained since the plasma 11 was concentrated in the region between the plates of the base materials 17a and 17b.

Although the base materials 17a and 17b are made of silicon in Example 1, a material for such base materials 17a and 17b, also serving as counter electrodes in the form of plate electrodes may alternatively be made of a carbon material, a conductive metal material, or a semiconductor material other than Si, such as SiC or Ge, for example. Such a base material may be applied onto the surface of an insulating material which insulates the plate electrodes 17a, 17b from the waveguide 5 which introduces the microwaves 18 into the region between said plate electrodes 17a, 17b.

Carbon source gas serving as the reaction gas may be prepared of hydrocarbon other than $CH_4$, alcohol, ketone or the like. Alternatively, solid carbon may be decomposed in a vapor phase to be supplied as a raw material.

EXAMPLE 2

The apparatus employed in Example 2 and the actual operation conditions were substantially the same as those of Example 1. Example 2 was different from Example 1 in that the reaction gas containing $H_2$ and $CH_4$ in the ratio 100:2 was supplied and Ar was added to the same while its discharge was so adjusted as to increase the pressure in a reaction tube 6, to 100 Torr.

As the result, it was possible to synthesize diamond films at a growth rate of 10 $\mu$m/h.

A similar effect can be obtained by adding inactive gas such as He, Ne, Kr, Xe or Rn in place of Ar for similarly stabilizing the plasma 11.

EXAMPLE 3

Figure 3:
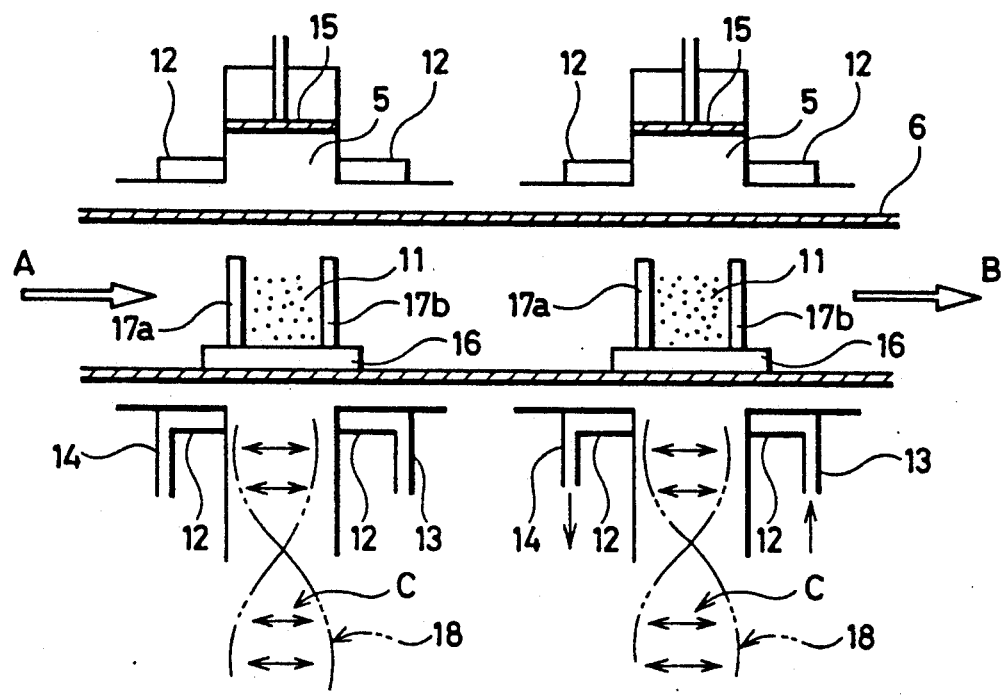
FIG. 3 is a sectional view typically showing the structure of an apparatus of the invention for synthesizing a hard material employed in Example 3 of the invention.

As shown in FIG. 3, microwaves were supplied to two portions of one reaction tube 6 with an input power of 600 W, to vapor-phase synthesize diamond films on two pairs of base materials 17a and 17b under conditions identical to those of Example 1. As the result, it was possible to synthesize diamond films on the base materials 17a and 17b over ranges of 30 mm in diameter at a rate of 5 $\mu$m/h.

EXAMPLE 4

Figure 4:
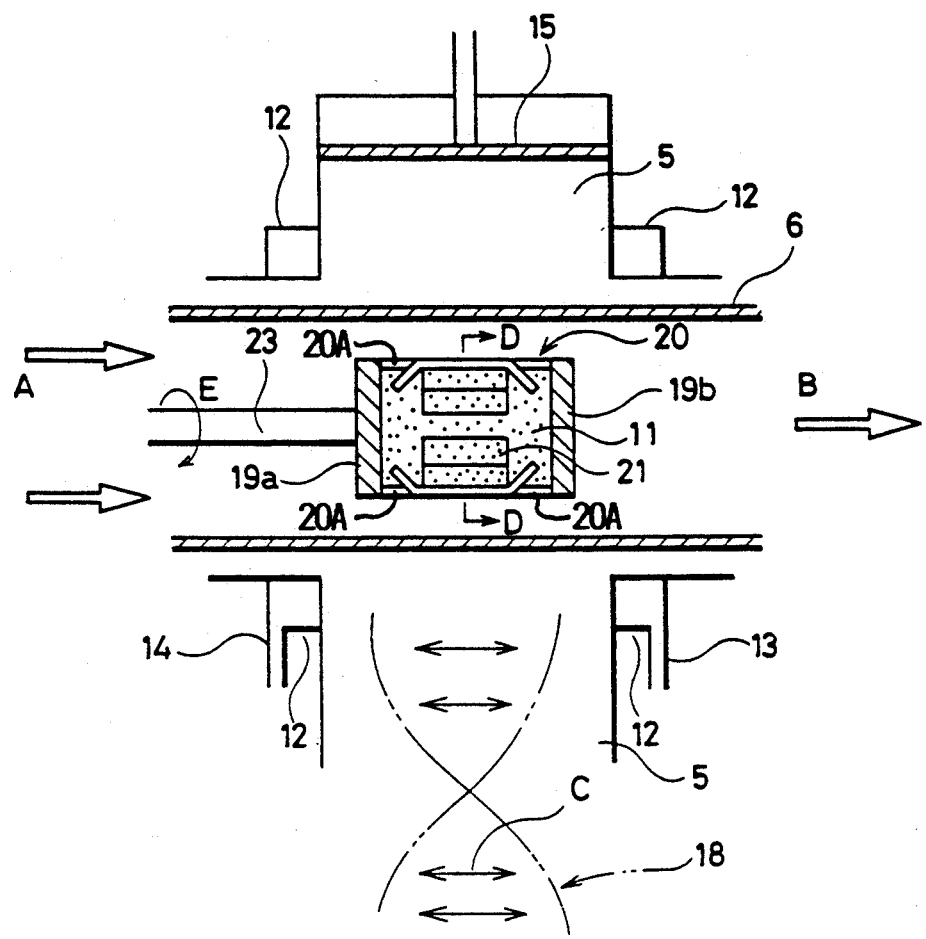
FIG. 4 is a sectional view typically showing the structure of an apparatus of the invention for synthesizing a hard material employed in Example 4 of the invention.
Figure 5:
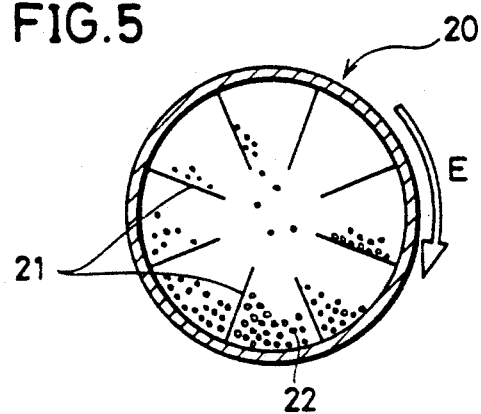
FIG. 5 is a sectional view taken along the line D—D in FIG. 4.

Example 4 carried out in an apparatus shown in FIG. 4, illustrating a reaction tube 6 and microwave generation means of the same construction as in Example 1. In Example 4, no base materials were employed as counter electrodes but a quartz jig 20 was formed by a cylindrical member having counter electrodes 19a and 19b on both end surfaces thereof. FIG. 5 is a sectional view taken along the line D—D in FIG. 4. As shown in FIG. 5, the quartz jig 20 has small partition plates 21, so that diamond abrasive grains 22 provided in its interior as base materials can be stirred by rotating the quartz jig 20 about a shaft 23, which is coaxial with a reaction tube 6, along an arrow E. The raw material gas enters into the jig 20 through holes 20A.

Such an apparatus was employed for vapor-phase synthesizing diamond under conditions identical to those of Example 2. As the result, the diamond abrasive grains of 100 $\mu$m in diameter, which were provided in the quartz jig 20, were grown into particles of 200 $\mu$m in diameter within one hour.

EXAMPLE 5

Similarly to Example 1, the apparatus shown in FIG. 2 was employed and three silicon discs having a diameter of 50 mm and a thickness of 3 mm were arranged as base materials vertically to the direction C of electric fields of microwaves 18 under the same conditions of reaction gas and microwaves as in Example 1. Diamond was synthesized under pressure of 20 Torr whereby the overall base materials were covered with plasma.

As the result, diamond films were formed over the entire surfaces of the base materials 50 mm in diameter at a growth rate of 0.2 $\mu$m/h.

When the pressure was increased to 40 Torr, the mean growth rate of diamond was reduced to 0.05 $\mu$m/h. When the pressure was further increased to 50 Torr, diamond was merely partially grown on the base materials.

According to Example 5, it was possible to homogeneously form diamond films on all of three or more base materials under pressure of not more than 40 Torr, thereby increasing the amount of generation of diamond.

While carbon source gas and hydrogen were mixed to prepare the raw material gas and inactive gas was further added thereto in the aforementioned Examples, the known fact has been experimentally confirmed that the quality of diamond is improved with an increase of transmissivity of the synthesized diamond etc. by employing or adding a material containing oxygen as or to the raw material gas. The invention also effectively uses this fact. The material containing oxygen can be prepared of alcohol, ketone, ether, $O_2$, $H_2O$, CO, $CO_2$, $NO_2$, NO, $O_3$ or the like, for example.

EXAMPLE 6

A synthesizing apparatus similar to that shown in FIG. 1 was employed and two Si base materials were arranged also similarly to Example 1. A reaction gas containing $H_2$, Ar, $NH_3$ and $B_2H$ in the ratios 100:40:10:3 was supplied and the pressure was maintained at 25 Torr. Microwaves of 800 W were introduced into the reaction gas and reaction was caused for 20 hours, whereby films of a hard material were grown on both base materials over ranges of 25 mm in diameter. The central portions of the hard material films had a maximum thickness of 7 $\mu$m. The crystal structure of this hard material was examined by X-ray diffraction, whereby it was found that the material was made of cubic boron nitride.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for synthesizing a hard material, comprising a reaction tube (6) made of electrically insulating material, said reaction tube having a longitudinal axis; means for supplying raw material gas into said reaction tube (6); means (5) for introducing microwaves

(18) into said reaction tube along a microwave propagation path extending substantially perpendicularly to said longitudinal axis thereby generating a plasma (11) along said path, base materials forming substrates (17a, 17b, 22) positioned in said reaction tube (6) parallel to said microwave propagation path for depositing a hard material on said substrates out of said plasma, at least two plate electrodes electrically insulated from said means (5) for introducing microwaves into said reaction tube, said plate electrodes being spaced from each other and facing each other across said microwave path, said plate electrodes being arranged in parallel to each other and perpendicularly to electric fields (C) caused by said microwaves in a region between said plate electrodes in said reaction tube (6) for maintaining said electrical fields in said region between said plate electrodes, said two plate electrodes being provided with said base materials (17a, 17b, 22) for depositing said hard material.

2. The apparatus for synthesizing a hard material in accordance with claim 1, further comprising a substrate support (16), wherein said base materials (17a, 17b) are formed as two flat plates facing each other and arranged in parallel to each other on said support (16) perpendicularly to said electric fields of said microwaves, said flat plates containing a conductive material and serving simultaneously as said plate electrodes.

3. The apparatus for synthesizing a hard material in accordance with claim 1, wherein said reaction tube is made at least of a material selected from the group consisting of quartz, alumina, beryllia and boron nitride.

4. The apparatus for synthesizing a hard material in accordance with claim 2, wherein said two flat plates of said base materials (17a, 17b) are formed as silicon plates.

5. The apparatus for synthesizing a hard material in accordance with claim 2, wherein said two flat plates of said base materials (17a, 17b) are formed of a member selected from the group consisting of semiconductor material other than silicon, a carbon material, and a conductive metal material.

6. The apparatus for synthesizing a hard material in accordance with claim 2, wherein said two flat plates of said base materials (17a, 17b) are formed by coating the surfaces of plates of an insulating material with at least one member selected from the group consisting of carbon material, conductive metal material, and semiconductor material.

7. The apparatus for synthesizing a hard material in accordance with claim 1, further comprising a hollow cylindrical member (20), said two plate electrodes (19a, 19b) being arranged one at each end of said hollow cylindrical member, means for rotating said cylindrical member (20) about its central axis, and holes in said cylindrical member for entry of said raw material gas into said cylindrical member.

8. The apparatus for synthesizing a hard material in accordance with claim 7, further comprising partition plates (21) in said cylindrical member (20), said partition plates extending radially inwardly from an inner periphery of said cylindrical member (20) at regular intervals along said periphery.

9. The apparatus for synthesizing a hard material in accordance with claim 1, wherein said plate electrodes (17a, 17b) are made of a member selected from the group consisting of stainless steel, molybdenum, and tungsten.

10. The apparatus for synthesizing a hard material in accordance with claim 1, further comprising exhaust means for decompressing said reaction tube (6).

11. The apparatus for synthesizing a hard material in accordance with claim 7, wherein said base materials are made of fine particles.

12. An apparatus for synthesizing a hard material, comprising: a reaction tube made of electrically insulating material; means for supplying a material gas into said reaction tube; means for introducing a microwave into said reaction tube for generating a plasma in said reaction tube; two flat base material members containing a conductive material, said flat base material members being arranged in said reaction tube perpendicularly to an electric field generated by said microwave in said reaction tube, said flat base material members being spaced from each other and extending in parallel to each other, said flat base material members being electrically insulated from said means for introducing said microwave, and wherein a main surface of each of said flat base material members extends in parallel to the direction in which said microwave proceeds.

13. An apparatus for synthesizing a hard material, comprising: a reaction tube made of an electrically insulating material, said reaction tube having a first central longitudinal axis; means for supplying a material gas into said reaction tube; means (5) for introducing a microwave into said reaction tube for generating a plasma in said reaction tube; a hollow tubular member having a second longitudinal axis and comprising a tube of quartz and two flat plate electrodes arranged at opposite ends of said tube of quartz; said flat plate electrodes being disposed in said reaction tube perpendicularly to an electric field generated by said microwave and electrically insulated from said microwave introducing means (5); means for rotating said hollow tubular member in said reaction tube around said second longitudinal axis; and partition plates (21) arranged equidistantly from each other around an inner circumference of said hollow tubular member, said partition plates (21) extending in parallel to said second longitudinal axis and radially inwardly from said inner circumference of said hollow tubular member.

* * * * *